US005579257A

United States Patent [19]

Tai

[11] Patent Number: 5,579,257
[45] Date of Patent: Nov. 26, 1996

[54] METHOD FOR READING AND RESTORING DATA IN A DATA STORAGE ELEMENT

[75] Inventor: Jy-Der D. Tai, Phoenix, Ariz.

[73] Assignee: Motorola, Inc., Schaumburg

[21] Appl. No.: 522,477

[22] Filed: Aug. 31, 1995

[51] Int. Cl.[6] ................................................. G11C 11/22
[52] U.S. Cl. .......................................... 365/145; 365/149
[58] Field of Search .................................... 365/145, 149, 365/117

[56] References Cited

U.S. PATENT DOCUMENTS

| 4,893,272 | 1/1990 | Eaton, Jr. et al. | |
| 5,031,143 | 7/1991 | Jaffe | 365/145 |
| 5,270,967 | 12/1993 | Moazzami et al. | 365/145 |

OTHER PUBLICATIONS

Joseph T. Evans and Richard Womack, Reprint of IEEE Journal of Solid-State Circuits, "An Experimental 512-bit Nonvolatile Memory with Ferroelectric Storage Cell", Oct. 1988, vol. 23, No. 5, pp. 1171–1175 (233–237).

Ramtron International Corporation, "Fram Technology", Jan. 1994.
Ramtron International Corporation, "Benefits of Ramtron's FM24C04 Serial FRAM Memory", Feb. 1994.
Ramtron International Corporation, "FM1208S FRAM Memory", Feb. 1994.

*Primary Examiner*—David C. Nelms
*Assistant Examiner*—Huan Hoang
*Attorney, Agent, or Firm*—Rennie William Dover

[57] ABSTRACT

A method for reading and restoring data in a FERAM (10) is provided. The FERAM (10) comprises a FET (11) and a ferroelectric capacitor (12). The FET (11) has a gate connected to a word line (14), a source coupled to a plate line (15) via the ferroelectric capacitor (12), and a drain connected to a bit line (16). The reading process begins by placing a predetermined amount of charge in a bit line capacitor (17), which in turn charges the ferroelectric capacitor (12) after the FET (11) is switched on, resulting in a voltage drop determined by data stored in the FERAM (10) at the bit line (16). A sense amplifier (18) adjusts the voltage at the bit line (16) accordingly to read data from the FERAM (10). Applying a voltage at the plate line (15) and switching the FET (11) off restore the data to the FERAM (10).

20 Claims, 2 Drawing Sheets

METHOD FOR READING AND RESTORING DATA IN A DATA STORAGE ELEMENT

BACKGROUND OF THE INVENTION

The present invention relates, in general, to reading data from and restoring data in a data storage element, and more particularly, to reading data from and restoring data in a ferroelectric random access memory (FERAM) cell.

The packing density and the power consumption of nonvolatile data storage elements are becoming increasingly important issues in low power applications, including portable computers and personal communication. Typically, a ferroelectric nonvolatile data storage element includes a capacitor with polarization retention for storing information and a switch, such as a bi-directional pass gate, for accessing the capacitor. When a bi-directional pass gate, e.g., a complementary metal oxide semiconductor (CMOS) pass gate, is used as a switch to access a ferroelectric memory capacitor, data can be stored and restored without degradation because there is no voltage drop across the pass gate. However, in high density FERAM designs, a pass gate having a single transistor is preferable because it uses less silicon area than a bi-directional pass gate.

As those skilled in the art are aware, a high level voltage transmitted through a single n-channel insulated gate field effect transistor pass gate is degraded by an amount equal to one transistor threshold voltage, which results in a voltage degradation when storing and restoring a high voltage representing a logical "one" in a FERAM cell. Similarly, a low level voltage transmitted through a single p-channel insulated gate field effect transistor pass gate is degraded by an amount equal to one transistor threshold voltage, which results in a voltage degradation when storing and restoring a low voltage representing a logical "zero" in a FERAM cell. As a result, the memory cell does not operate symmetrically and less charge is extracted from the memory cell during subsequent "read" operations.

One technique for preventing data degradation in a FEBAM having a single transistor pass gate is to use a word line booster. This technique uses a booster to apply a word line voltage, which is one threshold voltage higher than the supply voltage, to the gate electrode of the pass gate transistor. The higher gate voltage prevents the voltage degradation. However, each time the word line voltage is boosted, the booster consumes power. Furthermore, boosting the word line voltage requires additional circuitry that takes silicon area.

Accordingly, it would be advantageous to have an energy efficient technique for reading and fully restoring data in a nonvolatile memory cell that has a single transistor pass gate. It would be of further advantage for the technique to be implemented without using additional circuitry.

DETAILED DESCRIPTION OF THE DRAWINGS

Generally, the present invention provides a method for accessing data in a data storage element such as, for example, a ferroelectric memory cell. More particularly, the present invention provides a method for restoring data in a FERAM cell after a "read" operation.

Figure 1:
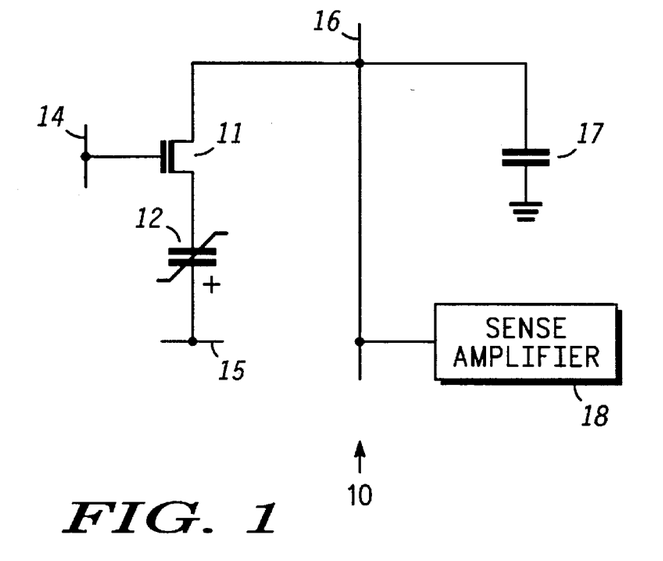
FIG. 1 illustrates a schematic diagram of a ferroelectric memory cell in a one-transistor one-capacitor configuration connected to a bit line capacitor and a sense amplifier for use in a method in accordance with a first embodiment of the present invention.

FIG. 1 illustrates a schematic diagram of a ferroelectric memory cell 10 in a one-transistor one-capacitor configuration. Memory cell 10 includes an n-channel insulated gate field effect transistor (FET) 11 serving as a switch, and a ferroelectric capacitor 12 serving as a capacitor with polarization retention. FET 11 has a gate electrode connected to a word line 14, a source electrode coupled to a plate line 15 via ferroelectric capacitor 12, and a drain electrode connected to a bit line 16. It should be noted that for a FET, a gate electrode serves as a control electrode, and source and drain electrodes serve as current conducting electrodes. Word line 14 transmits control signals to FET 11, plate line 15 transmits restoration signals to ferroelectric capacitor 12, and bit line 16 transmits data. The use of word lines, plate lines, and bit lines in memory devices is more fully described in "An Experimental 512-bit Nonvolatile Memory with Ferroelectric Storage Cell" by Evans and Womack (IEEE J. Solid-State Circuits, vol. 23, no. 5, pp. 1171–1175, October 1988), and which is hereby incorporated herein by reference. FIG. 1 further includes a bit line capacitor 17 connected to bit line 16 and to a sense amplifier 18. When enabled during a reading process, sense amplifier 18 senses the voltage at bit line 16 and compares it with a predetermined reference potential. The logical value being read from memory cell 10 is determined by the relation between the voltage at bit line 16 and the predetermined reference potential. The logical value of the data stored in memory cell 10 is determined by the polarization state of ferroelectric capacitor 12. The voltage across ferroelectric capacitor 12 is defined as positive when the potential at the electrode of ferroelectric capacitor 12 with a positive sign is higher than the potential at the other electrode of ferroelectric capacitor 12. The polarity of the charge in ferroelectric capacitor 12 is defined as positive when the charge on the electrode of ferroelectric capacitor 12 with the positive sign is positive.

Figure 2:
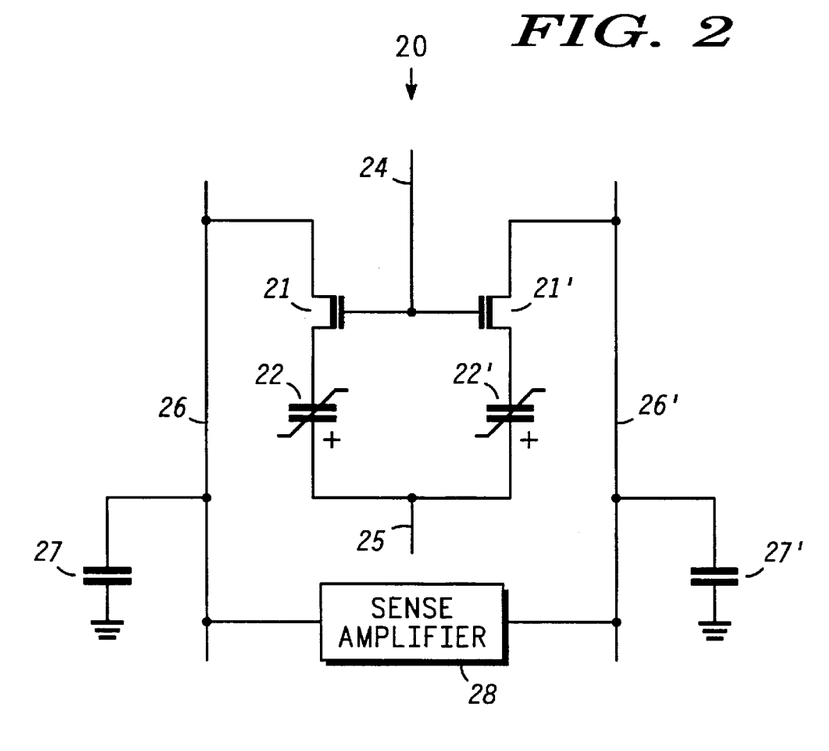
FIG. 2 illustrates a schematic diagram of a ferroelectric memory cell in a two-transistor two-capacitor configuration connected to a bit line capacitor, a complementary bit line capacitor, and a sense amplifier, for use in a method in accordance with a second embodiment of the present invention.

FIG. 2 illustrates a schematic diagram of a ferroelectric memory cell 20 in a two-transistor two-capacitor configuration. Memory cell 20 includes two n-channel insulated gate field effect transistors 21 and 21', and two ferroelectric capacitors 22 and 22'. A gate electrode of FET 21 and a gate electrode of FET 21' are connected to a word line 24. A source electrode of FET 21 and a source electrode of FET 21' are coupled to a plate line 25 via ferroelectric capacitor 22 and ferroelectric capacitor 22', respectively. A drain electrode of FET 21 and a drain electrode of FET 21' are connected to a bit line 26 and to a complementary bit line 26', respectively. FIG. 2 further includes a bit line capacitor 27 connected to bit line 26 and to a first channel of a sense amplifier 28. Likewise, a complementary bit line capacitor 27' is connected to complementary bit line 26' and to a second channel of sense amplifier 28. The polarization state of ferroelectric capacitor 22 determines the logical value of the data stored in memory cell 20. The polarization state of ferroelectric capacitor 22' is opposite to that of ferroelectric capacitor 22 and determines the complementary logical value of the data. The voltage across ferroelectric capacitor 22 is defined as positive when the potential at the electrode of ferroelectric capacitor 22 with a positive sign is higher than the potential at the other electrode of ferroelectric capacitor 22. The polarity of the charge in ferroelectric capacitor 22 is defined as positive when the charge on the electrode of ferroelectric capacitor 22 with the positive sign is positive. The voltage across ferroelectric capacitor 22' is defined as positive when the potential at the electrode of ferroelectric capacitor 22' with a positive sign is higher than the potential at the other electrode of ferroelectric capacitor 22'. The polarity of the charge in ferroelectric capacitor 22' is defined as positive when the charge on the electrode of ferroelectric capacitor 22' with the positive sign is positive.

Figure 3:
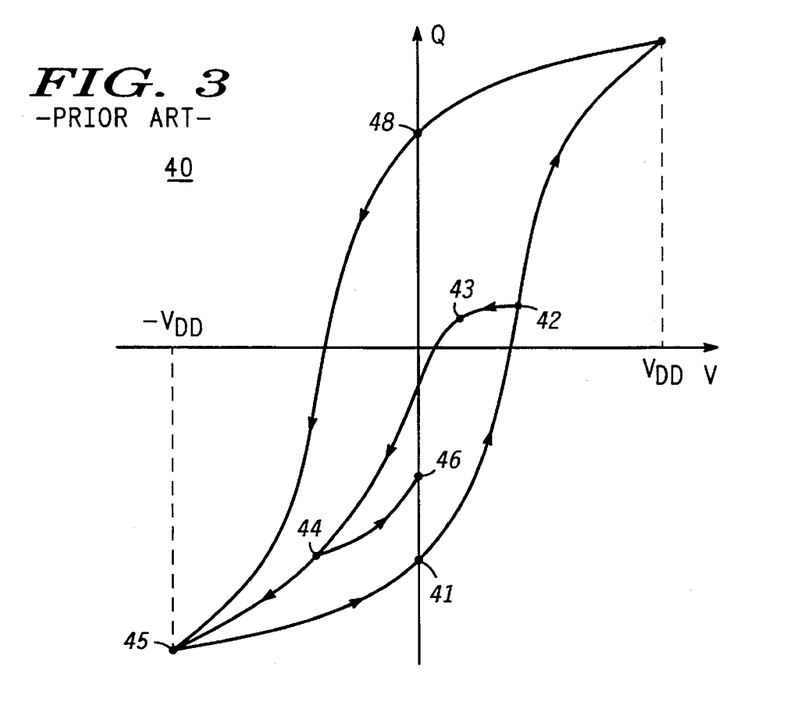
FIG. 3 illustrates a prior art hysteresis loop of polarization charge as a function of voltage in a ferroelectric capacitor during a reading process in accordance with an prior art embodiment.

FIG. 3 illustrates a prior art hysteresis loop 40 of polarization charge (Q) as a function of voltage (V) in a ferroelectric capacitor during a reading process. When a zero voltage is across a ferroelectric capacitor in a memory cell with data stored, the ferroelectric capacitor is in either of two polarization states: a logical "one" polarization state 41 or a logical "zero" polarization state 48. In one example, the state of ferroelectric capacitor in memory cell 10 of FIG. 1 follows hysteresis loop 40. If a logical "one" is stored in memory cell 10, ferroelectric capacitor 12 is in polarization state 41. If a logical "zero" is stored in memory cell 10, ferroelectric capacitor 12 is in polarization state 48. In another example, the states of ferroelectric capacitors 22 and 22' in memory cell 20 of FIG. 2 follow hysteresis loop 40. If a logical "one" is stored in memory cell 20, ferroelectric capacitor 22 is in polarization state 41 and ferroelectric capacitor 22' is in polarization state 48. If a logical "zero" is stored in memory cell 20, ferroelectric capacitor 22 is in polarization state 48 and ferroelectric capacitor 22' is in polarization state 41.

In accordance with the example using memory cell 10 of FIG. 1, before a "read" command is executed, word line 14, plate line 15, and bit line 16 are placed at a ground voltage level. FET 11 is in a non-conductive state and ferroelectric capacitor 12 is isolated from bit line 16. The voltage across the plates of ferroelectric capacitor 12 is zero. If a logical "one" is stored in memory cell 10, ferroelectric capacitor 12 is in polarization state 41. In accordance with the prior art embodiment using hysteresis loop 40 in FIG. 3, a "read" operation includes the following steps:

1) Bit line 16 is isolated from bit line voltage signals, i.e., bit line 16 is floating. The voltage at word line 14 and the voltage at plate line 15 are raised to a voltage level such as, for example, a supply voltage ($V_{DD}$). FET 11 is in a conductive state and couples ferroelectric capacitor 12 to bit line 16. An electric field created in ferroelectric capacitor 12 by the voltage at plate line 15 is in the opposite direction from its initial polarization field. The electric field depolarizes ferroelectric capacitor 12 and may polarize ferroelectric capacitor 12 in the opposite direction depending on the ratio of the capacitance of ferroelectric capacitor 12 to that of bit line capacitor 17. The polarization charge extracted from ferroelectric capacitor 12 charges bit line capacitor 17 and raises the voltage at bit line 16. Ferroelectric capacitor 12 is now in an extraction state 42. A large amount of electric charge, which is equal to the difference in the polarization charge between extraction state 42 and polarization state 41, is extracted from ferroelectric capacitor 12 and placed in bit line capacitor 17. The charge transmitted to bit line capacitor 17 raises the voltage at bit line 16 to a high voltage level.

2) Sense amplifier 18 is enabled, senses the high voltage level at bit line 16, and then raises the voltage at bit line 16 to $V_{DD}$, resulting in a logical "one" being read from memory cell 10. Ferroelectric capacitor 12 is now in an intermediate state 43.

3) Plate line 15 is placed at ground level and the high voltage at bit line 16 polarizes ferroelectric capacitor 12 in its original polarization direction. FET 11 becomes non-conductive when the voltage at the source electrode of FET 11 reaches a value that is less than the voltage at the gate electrode of FET 11 by an amount equal to the threshold voltage of FET 11. The voltage across ferroelectric capacitor 12 is less negative than $-V_{DD}$ by an amount equal to the threshold voltage of FET 11 and ferroelectric capacitor 12 is in a negatively charged state 44.

4) Ferroelectric capacitor 12 is isolated from bit line 16 by grounding word line 14, i.e., switching FET 11 off. The state of ferroelectric capacitor 12 changes from negatively charged state 44 to a degraded logical "one" polarization state 46 because of the leakage from ferroelectric capacitor 12.

In a subsequent "read" operation, ferroelectric capacitor 12 is initially in degraded polarization state 46, resulting in less charge being extracted from ferroelectric capacitor 12 when raising the voltages at word line 14 and plate line 15 to $V_{DD}$. One approach to avoid such a degradation in the quality of logical signals uses a booster to boost the voltage at word line 14 to a voltage that is greater than $V_{DD}$ by an amount equal to the threshold voltage of FET 11. Thus, FET 11 remains conductive until the voltage across ferroelectric capacitor 12 reaches $V_{DD}$. Instead of stopping at negatively charged state 44, the state of ferroelectric capacitor 12 changes from state 43 to a saturation state 45, in which state the voltage across ferroelectric capacitor 12 is $-V_{DD}$. When ferroelectric capacitor 12 is isolated from bit line 16 by grounding word line 14, the state of ferroelectric capacitor 12 changes from saturation state 45 to polarization state 41 because of the leakage from ferroelectric capacitor 12. Therefore, a logical "one" is restored without degradation. However, each time word line 14 is boosted, the booster consumes power. In addition, boosting word line 14 requires extra circuitry and extra silicon area. In portable electronic applications, power and silicon area are precious and, therefore, any extra consumption in power or silicon area is undesirable.

Figure 4:
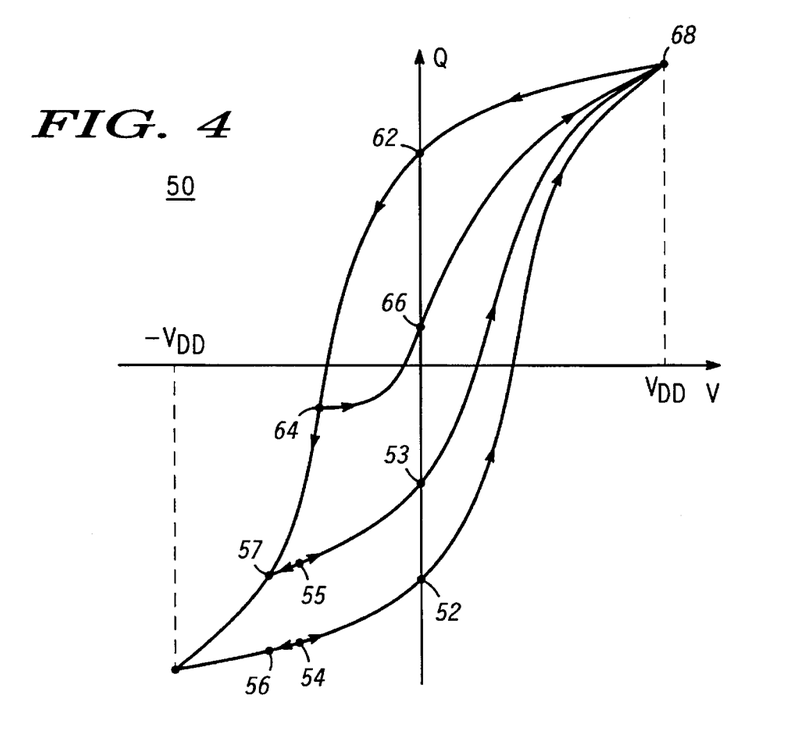
FIG. 4 illustrates a hysteresis loop of polarization charge as a function of voltage in a ferroelectric capacitor and during reading and writing processes in accordance with embodiments of the present invention.

FIG. 4 illustrates a hysteresis loop 50 of polarization charge (Q) as a function of voltage (V) in a ferroelectric capacitor during reading and writing processes in accordance with embodiments of the present invention. When a zero voltage is across a ferroelectric capacitor in a memory cell with data stored, the ferroelectric capacitor is in one of three polarization states: a logical "one" polarization state 52, an asymmetric logical "one" polarization state 53, or a logical "zero" polarization state 62. In one example, the state of ferroelectric capacitor 12 in memory cell 10 of FIG. 1 follows hysteresis loop 50. If a logical "one" is stored in memory cell 10, ferroelectric capacitor 12 is in state 52 or state 53. If a logical "zero" is stored in memory cell 10, ferroelectric capacitor 12 is in state 62. In another example, the states of ferroelectric capacitors 22 and 22' in memory cell 20 of FIG. 2 follow hysteresis loop 50. If a logical "one" is stored in memory cell 20, ferroelectric capacitor 22 is in state 52 or state 53, and ferroelectric capacitor 22' is in state 62. If a logical "zero" is stored in memory cell 20, ferroelectric capacitor 22 is in state 62, and ferroelectric capacitor 22' is in state 52 or state 53. In accordance with various embodiments of the present invention, when reading a logical "one" data from a memory cell, a substantially equal amount of charge is transmitted from a bit line capacitor to a ferroelectric capacitor regardless of whether the ferroelectric capacitor is in state 52 or state 53. Therefore, the quality of data in a memory cell when a ferroelectric capacitor is in state 53 is equally as good as the quality of data when the ferroelectric capacitor is in state 52.

In accordance with the example using cell 10 of FIG. 1, before a "read" command or a "write" command is executed, word line 14 and plate line 15 are placed at a ground voltage level. FET 11 is in a non-conductive state. Ferroelectric capacitor 12 is isolated from bit line 16 and the voltage across ferroelectric capacitor 12 is zero.

In accordance with a first embodiment of the present invention using hysteresis loop 50 in FIG. 4, when memory cell 10 stores a logical "one" and ferroelectric capacitor 12 is in logical "one" polarization state 52, a "read" operation includes the following steps:

1) A predetermined amount of charge is placed on bit line capacitor 17 by applying a charging voltage such as, for example, a supply voltage, $V_{DD}$, to bit line 16. Bit line 16 is then isolated from bit line voltage signals, i.e., bit line 16 is floating.

2) A control signal such as, for example, the supply voltage, $V_{DD}$, is applied to word line 14, resulting in FET 11 being switched into a conductive state. Ferroelectric capacitor 12 is coupled to bit line capacitor 17 via FET 11. Ferroelectric capacitor 12 and bit line capacitor 17 share the electric charge that is initially stored in bit line capacitor 17. Because the polarity of the charge transmitted from bit line capacitor 17 to ferroelectric capacitor 12 is the same as the polarity of the polarization in ferroelectric capacitor 12, which is initially in state 52, the transmitted charge further polarizes ferroelectric capacitor 12 and changes the state of ferroelectric capacitor 12 from state 52 to an intermediate state 54. A small amount of electric charge, equal to the difference in the polarization charge between state 54 and state 52, is transmitted from bit line capacitor 17 to ferroelectric capacitor 12. The small amount of charge transferred from bit line capacitor 17 results in a small voltage drop at bit line 16. The voltage at bit line 16 is still higher than the predetermined reference potential.

3) Sense amplifier 18 is enabled, compares the voltage at bit line 16 with the predetermined reference potential, and then applies a data value voltage such as, for example, $V_{DD}$, to bit line 16, resulting in a logical "one" being read from memory cell 10. The state of ferroelectric capacitor 12 changes to an extraction state 56 while FET 11 becomes non-conductive when the voltage at its source electrode reaches a value less than the voltage at word line 14 by an amount equal to the threshold voltage of FET 11. The voltage across ferroelectric capacitor 12 is now less negative than $-V_{DD}$ by an amount equal to the threshold voltage of FET 11.

4) FET 11 is switched off by grounding word line 14, resulting in ferroelectric capacitor 12 being isolated from bit line 16. The state of ferroelectric capacitor 12 changes from state 56 to state 52 because of the leakage from ferroelectric capacitor 12. If both plate line 15 and bit line 16 are grounded before switching FET 11 off, the voltage across ferroelectric capacitor 12 becomes zero and the state of ferroelectric capacitor 12 changes to state 52. In either case, a logical "one" is restored in memory cell 10.

After a reading process in which FET 11 is switched off before grounding plate line 15 and bit line 16, a subsequent reading process of memory cell 10 may start before ferroelectric capacitor 12 completes its transition from state 56 to state 52. In this case, the polarity of the remaining electric charge on ferroelectric capacitor 12 is the same as the polarity of the charge transmitted from bit line capacitor 17 to ferroelectric capacitor 12. Therefore, a smaller amount of charge is transmitted from bit line capacitor 17 to ferroelectric capacitor 12, resulting in a smaller voltage drop at bit line 16 compared with the case in which ferroelectric capacitor 12 is in state 52. A smaller voltage drop at bit line 16 transmits an enhanced logical "one" signal to sense amplifier 18.

In accordance with the first embodiment of the present invention using hysteresis loop 50 in FIG. 4, when memory cell 10 stores a logical "one" and ferroelectric capacitor 12 is in asymmetric logical "one" polarization state 53, a "read" operation includes the following steps:

1) A predetermined amount of charge is placed on bit line capacitor 17 by applying a charging voltage such as, for example, a supply voltage, $V_{DD}$, to bit line 16. Bit line 16 is then isolated from bit line voltage signals, i.e., bit line 16 is floating.

2) A control signal such as, for example, the supply voltage, $V_{DD}$, is applied to word line 14, resulting in FET 11 being switched into a conductive state. Ferroelectric capacitor 12 is coupled to bit line capacitor 17 via FET 11. Ferroelectric capacitor 12 and bit line capacitor 17 share the electric charge that is initially stored in bit line capacitor 17. Because the polarity of the charge transmitted from bit line capacitor 17 to ferroelectric capacitor 12 is the same as the polarity of the polarization in ferroelectric capacitor 12, which is initially in state 53, the transmitted charge further polarizes ferroelectric capacitor 12 and changes the state of ferroelectric capacitor 12 from state 53 to an asymmetric intermediate state 55 as shown. A small amount of electric charge, equal to the difference in the polarization charge between state 55 and state 53, is transmitted from bit line capacitor 17 to ferroelectric capacitor 12. The small amount of charge transferred from bit line capacitor 17 results in a small voltage drop at bit line 16. The voltage at bit line 16 is still higher than the predetermined reference potential.

3) Sense amplifier 18 is enabled, compares the voltage at bit line 16 with the predetermined reference potential, and then applies a data value voltage such as, for example, $V_{DD}$, to bit line 16, resulting in a logical "one" being read from memory cell 10. The state of ferroelectric capacitor 12 changes to an asymmetric extraction state 57 while FET 11 becomes non-conductive when the voltage at its source electrode reaches a value less than the voltage at word line 14 by an amount equal to the threshold voltage of FET 11. The voltage across ferroelectric capacitor 12 is now less negative than $-V_{DD}$ by an amount equal to the threshold voltage of FET 11.

4) FET 11 is switched off by grounding word line 14, resulting in ferroelectric capacitor 12 being isolated from bit line 16. The state of ferroelectric capacitor 12 changes from state 57 to state 53 because of the leakage from ferroelectric capacitor 12. If both plate line 15 and bit line 16 are grounded before switching FET 11 off, the voltage across ferroelectric capacitor 12 becomes zero and the state of ferroelectric capacitor 12 changes to state 53. In either case, a logical "one" is restored in memory cell 10.

After a reading process in which FET 11 is switched off before grounding plate line 15 and bit line 16, a subsequent reading process of memory cell 10 may start before ferroelectric capacitor 12 completes its transition from state 57 to state 53. In this case, the polarity of the remaining electric charge on ferroelectric capacitor 12 is the same as the polarity of the charge transmitted from bit line capacitor 17 to ferroelectric capacitor 12. Therefore, a smaller amount of charge is transmitted from bit line capacitor 17 to ferroelectric capacitor 12, resulting in a smaller voltage drop at bit line 16 compared with the case in which ferroelectric capacitor 12 is in state 53. A smaller voltage drop at bit line 16 transmits an enhanced logical "one" signal to sense amplifier 18.

In accordance with the first embodiment of the present invention using hysteresis loop 50 in FIG. 4, when memory cell 10 stores a logical "zero" and ferroelectric capacitor 12 is in logical "zero" polarization state 62, a "read" operation includes the following steps:

1) A predetermined amount of charge is placed on bit line capacitor 17 by applying a charging voltage such as, for example, a supply voltage, $V_{DD}$, to bit line 16. Bit line 16 is then isolated from bit line voltage signals, i.e., bit line 16 is floating.

2) A control signal such as, for example, the supply voltage, $V_{DD}$, is applied to word line 14, resulting in FET 11 being switched into a conductive state. Ferroelectric capacitor 12 is coupled to bit line capacitor 17 via FET 11. Ferroelectric capacitor 12 and bit line capacitor 17 share the electric charge that is initially stored in bit line capacitor 17. Because the polarity of the charge transmitted from bit line capacitor 17 to ferroelectric capacitor 12 is opposite to the polarity of the polarization in ferroelectric capacitor 12, which is initially in state 62, the transmitted charge depolarizes ferroelectric capacitor 12 and may polarize ferroelectric capacitor 12 in the opposite direction, depending on the ratio of the capacitance of bit line capacitor 17 to that of ferroelectric capacitor 12. The state of ferroelectric capacitor 12 changes from state 62 to an intermediate state 64. A large amount of electric charge, equal to the difference in the polarization charge between state 64 and state 62, is transmitted from bit line capacitor 17 to ferroelectric capacitor 12. The large amount of charge transferred from bit line capacitor 17 results in a large voltage drop at bit line 16. The voltage at bit line 16 is now lower than the predetermined reference potential.

3) Sense amplifier 18 is enabled, compares the voltage at bit line 16 with the predetermined reference potential, and then lowers the voltage at bit line 16 to ground voltage level, resulting in a logical "zero" being read from memory cell 10. The voltage across ferroelectric capacitor 12 is zero and the state of ferroelectric capacitor 12 changes to an intermediate state 66.

4) A restoration signal such as, for example, the supply voltage, $V_{DD}$, is applied to plate line 15. The voltage across ferroelectric capacitor 12 is $V_{DD}$ and the state of ferroelectric capacitor 12 changes to a saturation state 68.

5) FET 11 is switched off by grounding word line 14, resulting in ferroelectric capacitor 12 being isolated from bit line 16. The state of ferroelectric capacitor 12 changes from state 68 to state 62 because of the leakage from ferroelectric capacitor 12. If both plate line 15 and bit line 16 are grounded before switching FET 11 off, the voltage across ferroelectric capacitor 12 becomes zero and the state of ferroelectric capacitor 12 changes to state 62. In either case, a logical "zero" is restored in memory cell 10.

After a reading process in which FET 11 is switched off before grounding plate line 15 and bit line 16, a subsequent reading process of memory cell 10 may start before ferroelectric capacitor 12 completes its transition from state 68 to state 62. In this case, the polarity of the remaining electric charge on ferroelectric capacitor 12 is opposite to the polarity of the charge transmitted from bit line capacitor 17 to ferroelectric capacitor 12. Therefore, a larger amount of charge is transmitted from bit line capacitor 17 to ferroelectric capacitor 12, resulting in a larger voltage drop at bit line 16 compared with the case in which ferroelectric capacitor 12 is in state 62. A larger voltage drop at bit line 16 transmits an enhanced logical "zero" signal to sense amplifier 18.

In accordance with the first embodiment of the present invention using hysteresis loop 50 in FIG. 4, a "write" operation to store a logical "one" in memory cell includes the following steps:

1) The voltage at bit line 16 is raised to, for example, $V_{DD}$, which represents logical "one".

2) A control signal such as, for example, the supply voltage, $V_{DD}$, is applied to word line 14, resulting in FET 11 being switched into a conductive state. Ferroelectric capacitor 12 is coupled to bit line capacitor 17 via FET 11. FET 11 becomes non-conductive when the voltage at its source electrode reaches a value less than the voltage at word line 14 by an amount equal to the threshold voltage of FET 11. The voltage across ferroelectric capacitor 12 is less negative than $-V_{DD}$ by an amount equal to the one threshold voltage of FET 11. The state of ferroelectric capacitor 12 either changes to state 56 if ferroelectric capacitor 12 is initially in state 52, or changes to state 57 if ferroelectric capacitor 12 is initially in state 53 or state 62.

3) FET 11 is switched off by grounding word line 14, resulting in ferroelectric capacitor 12 being isolated from bit line 16. The state of ferroelectric capacitor 12 changes either from state 56 to logical "one" polarization state 52, or from state 57 to asymmetric logical "one" polarization state 53 because of the leakage from ferroelectric capacitor 22. If both plate line 15 and bit line 16 are grounded before switching FET 11 off, the voltage across ferroelectric capacitor 12 becomes zero and the state of ferroelectric capacitor 12 changes either from state 56 to state 52 or from state 57 to state 53. In either case, a logical "one" is stored in memory cell 10.

In accordance with the first embodiment of the present invention using hysteresis loop 50 in FIG. 4, a "write" operation to store a logical "zero" in memory cell 10 includes the following steps:

1) The voltage at bit line 16 is lowered to ground voltage level, which represents logical "zero".

2) A control signal such as, for example, the supply voltage, $V_{DD}$, is applied to word line 14, resulting in FET 11 being switched into a conductive state. Ferroelectric capacitor 12 is coupled to bit line capacitor 17 via FET 11. The voltage across ferroelectric capacitor 12 is zero and ferroelectric capacitor 12 remains in its initial state.

3) The voltage at plate line 15 is raised to $V_{DD}$. The voltage across ferroelectric capacitor 12 is now $V_{DD}$, and the state of ferroelectric capacitor 12 changes to state 68, regardless of the initial state of ferroelectric capacitor 12.

4) FET 11 is switched off by grounding word line 14, resulting in ferroelectric capacitor 12 being isolated from bit line 16. Ferroelectric capacitor 12 changes from state 68 to logical "zero" polarization state 62 because of the leakage from ferroelectric capacitor 12. If both plate line 15 and bit line 16 are grounded before switching FET 11 off, the voltage across ferroelectric capacitor 12 becomes zero and the state of ferroelectric capacitor 12 changes from state 68 to state 62. In either case, a logical "zero" is stored in memory cell 10.

In accordance with the example using memory cell 20 of FIG. 2, before a "read" command or a "write" command is executed, word line 24 and plate line 25 are placed at a ground voltage level. FET 21 and FET 21' are non-conductive. Ferroelectric capacitor 22 and ferroelectric capacitor 22' are isolated from bit line 26 and complementary bit line 26' respectively. The voltages across ferroelectric capacitors 22 and 22' are zero.

In accordance with a second embodiment of the present invention using hysteresis loop 50, when memory cell 20 stores a logical "one" with ferroelectric capacitor 22 in logical "one" polarization state 52 and ferroelectric capacitor 22' in logical "zero" polarization state 62, a "read" operation includes the following steps:

1) A predetermined amount of charge is placed on both bit line capacitor 27 and complementary bit line capacitor 27' by applying a charging voltage such as, for example, a supply voltage, $V_{DD}$, to both bit line 26 and complementary bit line 26'. Bit line 26 and complementary bit line 26' are then isolated from bit line voltage signals, i.e., bit line 26 and complementary bit line 26' are floating.

2) A control signal such as, for example, the supply voltage, $V_{DD}$, is applied to word line 24, resulting in FET 21 and FET 21' being conductive. Ferroelectric capacitor 22 and ferroelectric capacitor 22' are coupled to bit line capacitor 27 via FET 21 and to complementary bit line capacitor 27' via FET 21', respectively. Ferroelectric capacitor 22 and bit line capacitor 27 share the electric charge that is initially stored in bit line capacitor 27. Because the polarity of the charge transmitted from bit line capacitor 27 to ferroelectric capacitor 22 is the same as the polarity of the polarization in ferroelectric capacitor 22, which is initially in state 52, the transmitted charge further polarizes ferroelectric capacitor 22 and changes the state of ferroelectric capacitor 22 from state 52 to intermediate state 54. A small amount of electric charge, equal to the difference in the polarization charge between state 54 and state 52, is transmitted from bit line capacitor 27 to ferroelectric capacitor 22. The small amount of charge transferred from bit line capacitor 27 results in a small voltage drop at bit line 26. Likewise, ferroelectric capacitor 22' and complementary bit line capacitor 27' share the electric charge that is initially stored in complementary bit line capacitor 27'. However, because the polarity of the charge transmitted from complementary bit line capacitor 27' to ferroelectric capacitor 22' is opposite to the polarity of the polarization in ferroelectric capacitor 22' which is initially in state 62, the transmitted charge depolarizes ferroelectric capacitor 22' and may polarize ferroelectric capacitor 22' in the opposite direction, depending on the ratio of the capacitance of complementary bit line capacitor 27' to that of ferroelectric capacitor 22'. The state of ferroelectric capacitor 22' changes from state 62 to intermediate state 64. A large amount of electric charge, equal to the difference in the polarization charge between intermediate state 64 and state 62, is transmitted from complementary bit line capacitor 27' to ferroelectric capacitor 22'. The large amount of charge transferred from complementary bit line capacitor 27' results in a large voltage drop at complementary bit line 26'. The voltage at bit line 26 is now higher than the voltage at complementary bit line 26'.

3) Sense amplifier 28, having the first channel connected to bit line 26 and the second channel connected to complementary bit line 26', is enabled, compares the voltage at bit line 26 with the voltage at complementary bit line 26', and then raises the voltage at bit line 26 to $V_{DD}$, and lowers the voltage at complementary bit line 26' to ground voltage level, resulting in a logical "one" being read from memory cell 20. The state of ferroelectric capacitor 22 changes to extraction state 56 while FET 21 becomes non-conductive when the voltage at its source electrode reaches a value less than the voltage at word line 24 by an amount equal to the threshold voltage of FET 21. The voltage across ferroelectric capacitor 22 is less negative than $-V_{DD}$ by an amount equal to the threshold voltage of FET 21. The voltage across ferroelectric capacitor 22' is zero and the state of ferroelectric capacitor 22' changes to intermediate state 66.

4) A restoration signal such as, for example, the supply voltage, $V_{DD}$, is applied to plate line 25. Because FET 21 is non-conductive, ferroelectric capacitor 22 remains in state 56. The voltage across ferroelectric capacitor 22' is now $V_{DD}$ and the state of ferroelectric capacitor 22' changes to saturation state 68.

5) FET 21 and FET 21' are switched off by grounding word line 24, resulting in ferroelectric capacitor 22 and ferroelectric capacitor 22' being isolated from bit line 26 and complementary bit line 26', respectively. The state of ferroelectric capacitor 22 changes from state 56 to state 52 because of the leakage from ferroelectric capacitor 22. The state of ferroelectric capacitor 22' changes from state 68 to state 62 because of the leakage from ferroelectric capacitor 22'. If plate line 25, bit line 26, and complementary bit line 26', are grounded before switching FETs 21 and 21' off, the voltages across ferroelectric capacitors 22 and 22' become zero. The state of ferroelectric capacitor 22 changes from state 56 to state 52; and the state of ferroelectric capacitor 22' changes from state 68 to state 62. In either case, a logical "one" is restored in memory cell 20.

After a reading process in which FETs 21 and 21' are switched off before grounding plate line 25, bit line 26, and complementary bit line 26', a subsequent reading process of memory cell 20 may start before ferroelectric capacitor 22 completes its transition from state 56 to state 52 or before ferroelectric capacitor 22' completes its transition from state 68 to state 62. In this case, the polarity of the remaining electric charge on ferroelectric capacitor 22 is the same as the polarity of the charge transmitted from bit line capacitor 27 to ferroelectric capacitor 22. Therefore, a smaller amount of charge is transmitted from bit line capacitor 27 to ferroelectric capacitor 22, resulting in a smaller voltage drop at bit line 26 compared with the case in which ferroelectric capacitor 22 is in state 52. The polarity of the remaining electric charge on ferroelectric capacitor 22' is opposite to the polarity of the charge transmitted from complementary bit line capacitor 27' to ferroelectric capacitor 22'. Therefore, a larger amount of charge is transmitted from complementary bit line capacitor 27' to ferroelectric capacitor 22', resulting in a larger voltage drop at complementary bit line 26' compared with the case in which ferroelectric capacitor 22' is in state 62. The smaller voltage drop at bit line 26 or the larger voltage drop at complementary bit line 26' transmits an enhanced logical "one" signal to sense amplifier 28.

In accordance with the second embodiment of the present invention using hysteresis loop 50, when memory cell 20 stores a logical "one" with ferroelectric capacitor 22 in asymmetric logical "one" polarization state 53 and ferroelectric capacitor 22' in logical "zero" polarization state 62, a "read" operation includes the following steps:

1) A predetermined amount of charge is placed on both bit line capacitor 27 and complementary bit line capacitor 27' by applying a charging voltage such as, for example, a supply voltage, $V_{DD}$, to both bit line 26 and complementary bit line 26'. Bit line 26 and complementary bit line 26' are then isolated from bit line voltage signals, i.e., bit line 26 and complementary bit line 26' are floating.

2) A control signal such as, for example, the supply voltage, $V_{DD}$, is applied to word line 24, resulting in FET 21 and FET 21' being conductive. Ferroelectric capacitor 22 and ferroelectric capacitor 22' are coupled to bit line capacitor 27 via FET 21 and to complementary bit line capacitor 27' via FET 21', respectively. Ferroelectric capacitor 22 and bit line capacitor 27 share the electric charge that is initially stored in bit line capacitor 27. Because the polarity of the charge transmitted from bit line capacitor 27 to ferroelectric capacitor 22 is the same as the polarity of the polarization in ferroelectric capacitor 22, which is initially in state 53, the transmitted charge further polarizes ferroelectric capacitor 22 and changes the state of ferroelectric capacitor 22 from state 52 to asymmetric intermediate state 55. A small amount of electric charge, equal to the difference in the polarization charge between state 55 and state 53, is transmitted from bit line capacitor 27 to ferroelectric capacitor 22. The small amount of charge transferred from bit line capacitor 27 results in a small voltage drop at bit line 26. Likewise, ferroelectric capacitor 22' and complementary bit line capacitor 27' share the electric charge that is initially stored in complementary bit line capacitor 27'. However, because the polarity of the charge transmitted from complementary bit line capacitor 27' to ferroelectric capacitor 22' is opposite to the polarity of the polarization in ferroelectric capacitor 22' which is initially in state 62, the transmitted charge depolarizes ferroelectric capacitor 22' and may polarize ferroelectric capacitor 22' in the opposite direction, depending on the ratio of the capacitance of complementary bit line capacitor 27' to that of ferroelectric capacitor 22'. The state of ferroelectric capacitor 22' changes from state 62 to intermediate state 64. A large amount of electric charge, equal to the difference in the polarization charge between intermediate state 64 and state 62, is transmitted from complementary bit line capacitor 27' to ferroelectric capacitor 22'. The large amount of charge transferred from complementary bit line capacitor 27' results in a large voltage drop at complementary bit line 26'. The voltage at bit line 26 is now higher than the voltage at complementary bit line 26'.

3) Sense amplifier 28, having the first channel connected to bit line 26 and the second channel connected to complementary bit line 26', is enabled, compares the voltage at bit line 26 with the voltage at complementary bit line 26', and then raises the voltage at bit line 26 to $V_{DD}$, and lowers the voltage at complementary bit line 26' to ground voltage level, resulting in a logical "one" being read from memory cell 20. The state of ferroelectric capacitor 22 changes to asymmetric extraction state 57 while FET 21 becomes non-conductive when the voltage at its source electrode reaches a value less than the voltage at its gate electrode by an amount equal to the threshold voltage of FET 21. The voltage across ferroelectric capacitor 22 is less negative than $-V_{DD}$ by an amount equal to the threshold voltage of FET 21. The voltage across ferroelectric capacitor 22' is zero and the state of ferroelectric capacitor 22' changes to intermediate state 66.

4) A restoration signal such as, for example, the supply voltage, $V_{DD}$, is applied to plate line 25. Because FET 21 is non-conductive, ferroelectric capacitor 22 remains in state 57. The voltage across ferroelectric capacitor 22' is now $V_{DD}$ and the state of ferroelectric capacitor 22' changes to saturation state 68.

5) FET 21 and FET 21' are switched off by grounding word line 24, resulting in ferroelectric capacitor 22 and ferroelectric capacitor 22' being isolated from bit line 26 and complementary bit line 26', respectively. The state of ferroelectric capacitor 22 changes from state 57 to state 53 because of the leakage from ferroelectric capacitor 22. The state of ferroelectric capacitor 22' changes from state 68 to state 62 because of the leakage from ferroelectric capacitor 22'. If plate line 25, bit line 26, and complementary bit line 26' are grounded before switching FETs 21 and 21' off, the voltages across ferroelectric capacitors 22 and 22' become zero. The state of ferroelectric capacitor 22 changes from state 57 to state 53; and the state of ferroelectric capacitor 22' changes from state 68 to state 62. In either case, a logical "one" is restored in memory cell 20.

After a reading process in which FETs 21 and 21' are switched off before grounding plate line 25, bit line 26, and complementary bit line 26', a subsequent reading process of memory cell 20 may start before ferroelectric capacitor 22 completes its transition from state 57 to state 53 or before ferroelectric capacitor 22' completes its transition from state 68 to state 62. In this case, the polarity of the remaining electric charge on ferroelectric capacitor 22 is the same as the polarity of the charge transmitted from bit line capacitor 27 to ferroelectric capacitor 22. Therefore, a smaller amount of charge is transmitted from bit line capacitor 27 to ferroelectric capacitor 22, resulting in a smaller voltage drop at bit line 26 compared with the case in which ferroelectric capacitor 22 is in state 53. The polarity of the remaining electric charge on ferroelectric capacitor 22' is opposite to the polarity of the charge transmitted from complementary bit line capacitor 27' to ferroelectric capacitor 22'. Therefore, a larger amount of charge is transmitted from complementary bit line capacitor 27' to ferroelectric capacitor 22' resulting in a larger voltage drop at complementary bit line 26' compared with the case in which ferroelectric capacitor 22' is in state 62. The smaller voltage drop at bit line 26 or the larger voltage drop at complementary bit line 26' transmits an enhanced logical "one" signal to sense amplifier 28.

In accordance with the second embodiment of the present invention using the hysteresis loop 50 in FIG. 4, when memory cell 20 of FIG. 2 stores a logical "zero", a "read" operation includes the steps analogous to those for a "read" operation when memory cell 20 stores a logical "one". It should be noted that during the process of reading a logical "zero" from memory cell 20, the voltage at bit line 26 is lowered to ground voltage level and the voltage at complementary bit line 26' is raised to $V_{DD}$ when sense amplifier 28 is enabled. It should also be noted that when a logical "zero" is stored in memory cell 20, ferroelectric capacitor 22 is initially in logical "zero" polarization state 62 and its state changes from state 62, through intermediate state 64, intermediate state 66, and saturation state 68, back to state 62 during the reading process. On the other hand, ferroelectric capacitor 22' is either initially in logical "one" polarization state 52 and its state changes from state 52, through intermediate state 54 and extraction state 56, back to state 52 during the reading process, or initially in asymmetric logical "one" polarization state 53 and its state changes from state 53, through asymmetric intermediate state 55 and asymmetric extraction state 57, back to state 53 during the reading process.

In accordance with the second embodiment of the present invention, a "write" operation to store a logical "one" into memory cell 20 of FIG. 2 includes the following steps:

1) The voltage at bit line 26 is raised to, for example, $V_{DD}$, which represents logical "one". The voltage at complementary bit line 26' is lowered to ground voltage level, which represents the complementary value of logical "one".

2) A control signal such as, for example, the supply voltage, $V_{DD}$, is applied to word line 24, resulting in FET 21 and FET 21' becoming conductive, ferroelectric capacitor 22 becoming coupled to bit line 26 via FET 21, and ferroelectric capacitor 22' becoming coupled to complementary bit line 26' via FET 21'. FET 21 becomes non-conductive when the voltage at its source electrode reaches a value less than the voltage at word line 24 by an amount equal to the threshold voltage of FET 21. The voltage across ferroelectric capacitor 22 is less negative than $-V_{DD}$ by an amount equal to the threshold voltage of FET 21. The state of ferroelectric capacitor 22 either changes to state 56 if ferroelectric capacitor 22 is initially in state 52, or changes to state 57 if ferroelectric capacitor 22 is initially in state 53 or state 62. The voltage across ferroelectric capacitor 22' is zero and ferroelectric capacitor 22' remains in its initial state.

3) The voltage at plate line 25 is raised to $V_{DD}$. Because FET 21 is non-conductive, ferroelectric capacitor 22 is isolated from bit line 26 and remains in either state 56 or state 57. The voltage across ferroelectric capacitor 22' is now $V_{DD}$, and the state of ferroelectric capacitor 22' changes to state 68, regardless of the initial state of ferroelectric capacitor 22'.

4) FET 21 and FET 21' are switched off by grounding word line 24. Ferroelectric capacitor 22 and ferroelectric capacitor 22' are isolated from bit line 26 and complementary bit line 26' respectively. Ferroelectric capacitor 22 changes either from state 56 to logical "one" polarization state 52, or from state 57 to asymmetric logical "one" polarization state 53 because of the leakage from ferroelectric capacitor 22. Ferroelectric capacitor 22' changes from state 68 to logical "zero" polarization state 62 because of the leakage from ferroelectric capacitor 22'. Therefore, a logical "one" is stored in memory cell 20.

In accordance with the second embodiment of the present invention, a "write" operation to store a logical "zero" into memory cell 20 of FIG. 2 includes steps analogous to those for a "write" operation to store a logical "one" into memory cell 20. It should be noted when writing a logical "zero" to memory cell 20, the voltage at bit line 26 is lowered to ground voltage level, which represents logical "zero", and the voltage at complementary bit line 26' is raised to $V_{DD}$, which represents the complementary value of logical "zero". Therefore, the state of ferroelectric capacitor 22 changes to logical "zero" polarization state 62 via saturation state 68 regardless of its initial state. The state of ferroelectric capacitor 22' either changes to logical "one" polarization state 52 via state 56 if ferroelectric capacitor 22' is initially in state 52, or changes to asymmetric logical "one" polarization state 53 via state 57 if ferroelectric capacitor 22' is initially in state 53 or state 62.

By now it should be appreciated that a method for reading and restoring data in a nonvolatile memory cell has been provided. The method reads data from and fully restores data in a nonvolatile memory cell with a single transistor pass gate without using techniques such as word line boosting. It provides an energy efficient alternative to the prior art techniques. Furthermore, the present invention does not need a word line booster to write data into a memory cell. Therefore, using the method in accordance with the present invention also simplifies circuitry and saves silicon area compared with the prior art.

I claim:

1. A method for reading and restoring data in a data storage element, comprising the steps of:

providing the data storage element having a switch and a capacitor with polarization retention, wherein the switch has a control electrode coupled for receiving control signals, a first current conducting electrode coupled via the capacitor with polarization retention for receiving restoration signals, and a second current conducting electrode coupled for transmitting data;

providing data in the data storage element;

placing the switch in a non-conductive state;

applying a first restoration signal to the first current conducting electrode of the switch via the capacitor with polarization retention;

applying a charging voltage to the second current conducting electrode of the switch;

removing the charging voltage applied to the second current conducting electrode of the switch;

placing the switch in a conductive state;

applying a data value voltage to the second current conducting electrode of the switch in response to a voltage at the second current conducting electrode of the switch to read data from the data storage element;

applying a second restoration signal to the first current conducting electrode of the switch via the capacitor with polarization retention; and placing the switch in the non-conductive state to restore data in the data storage element.

2. The method for reading and restoring data in a data storage element as claimed in claim 1, wherein the step of providing the data storage element further includes providing a word line coupled to the control electrode of the switch, a plate line coupled to the first current conducting electrode of the switch via the capacitor with polarization retention, and a bit line coupled to the second current conducting electrode of the switch.

3. The method for reading and restoring data in a data storage element as claimed in claim 1, wherein the step of providing the data storage element includes providing an n-channel insulated gate field effect transistor serving as the switch and providing a ferroelectric capacitor serving as the capacitor with polarization retention, wherein the n-channel insulated gate field effect transistor has a gate electrode serving as the control electrode of the switch, a source electrode serving as the first current conducting electrode of the switch, and a drain electrode serving as the second current conducting electrode of the switch.

4. The method for reading and restoring data in a data storage element as claimed in claim 1, wherein the step of providing data in the data storage element includes the steps of:

applying the first restoration signal to the first current conducting electrode of the switch via the capacitor with polarization retention;

applying a data storing voltage to the second current conducting electrode of the switch;

placing the switch in a conductive state;

applying the second restoration signal to the first current conducting electrode of the switch via the capacitor with polarization retention; and placing the switch in a non-conductive state to store data in the data storage element.

5. The method for reading and restoring data in a data storage element as claimed in claim 4, wherein the step of applying a data storing voltage includes applying a voltage determined by the data to be stored in the data storage element.

6. The method for reading and restoring data in a data storage element as claimed in claim 1, wherein the step of placing the switch in a non-conductive state includes applying a first control signal to the control electrode of the switch.

7. The method for reading and restoring data in a data storage element as claimed in claim 1, wherein the step of applying a second restoration signal includes applying the first restoration signal.

8. A method for reading and restoring data in a ferroelectric memory cell, comprising the steps of:

providing the ferroelectric memory cell having a word line, a plate line, a bit line, a field effect transistor, and a ferroelectric capacitor, wherein the field effect transistor has a gate electrode coupled to the word line, a source electrode coupled to the plate line via the ferroelectric capacitor, and a drain electrode coupled to the bit line;

writing data into the ferroelectric memory cell;

placing the field effect transistor in a non-conductive state;

applying a first restoration signal to the plate line;

charging the bit line;

placing the field effect transistor in a conductive state;

applying a data value voltage to the bit line in response to a potential at the bit line to read data from the ferroelectric memory cell;

applying a second restoration signal to the plate line; and placing the field effect transistor in the non-conductive state to restore data in the ferroelectric memory cell.

9. The method for reading and restoring data in a ferroelectric memory cell as claimed in claim 8, wherein the step of providing the ferroelectric memory cell includes providing an n-channel insulated gate field effect transistor serving as the field effect transistor, wherein the n-channel insulated gate field effect transistor has a threshold voltage.

10. The method for reading and restoring data in a ferroelectric memory cell as claimed in claim 9, wherein the step of placing the field effect transistor in a non-conductive state includes applying a voltage lower than the threshold voltage of the n-channel insulated gate field effect transistor to the word line.

11. The method for reading and restoring data in a ferroelectric memory cell as claimed in claim 8, wherein the step of applying a first restoration signal includes applying a ground voltage to the plate line.

12. The method for reading and restoring data in a ferroelectric memory cell as claimed in claim 8, wherein the step of applying a second restoration signal includes applying a supply voltage to the plate line.

13. The method for reading and restoring data in a ferroelectric memory cell as claimed in claim 8, wherein the step of charging the bit line includes the steps of:

applying a charging voltage to the bit line; and removing the charging voltage applied to the bit line.

14. The method for reading and restoring data in a ferroelectric memory cell as claimed in claim 8, wherein the step of applying a data value voltage to the bit line in response to a potential at the bit line includes the steps of:

providing a predetermined reference potential;

applying a ground voltage to the bit line in response to the potential at the bit line lower than the predetermined reference potential; and applying a supply voltage to the bit line in response to the potential at the bit line higher than the predetermined reference potential.

15. A method for reading and restoring data in a ferroelectric memory cell, comprising the steps of:

providing the ferroelectric memory cell having a word line, a plate line, a bit line, a complementary bit line, a first field effect transistor, a second field effect transistor, a first ferroelectric capacitor, and a second ferroelectric capacitor, wherein a gate electrode of the first field effect transistor and a gate electrode of the second field effect transistor are coupled to the word line, a source electrode of the first field effect transistor and a source electrode of the second field effect transistor are coupled to the plate line via the first ferroelectric capacitor and the second ferroelectric capacitor, respectively, and a drain electrode of the first field effect transistor and a drain electrode of the second field effect transistor are coupled to the bit line and the complementary bit line, respectively;

writing data into the ferroelectric memory cell;

placing the first and second field effect transistors in a non-conductive state;

applying a first restoration signal to the plate line;

charging the bit line and the complementary bit line;

placing the first and second field effect transistors in a conductive state;

applying a first data value voltage to the bit line and applying a second data value voltage to the complementary bit line in response to a potential at the bit line higher than a potential at the complementary bit line to read a first logical value from the ferroelectric memory cell;

applying the second data value voltage to the bit line and applying the first data value voltage to the complementary bit line in response to a potential at the bit line lower than a potential at the complementary bit line to read a second logical value complementary to the first logical value from the ferroelectric memory cell;

applying a second restoration signal to the plate line; and placing the first and second field effect transistors in the non-conductive state to restore data in the ferroelectric memory cell.

16. The method for reading and restoring data in a ferroelectric memory cell as claimed in claim 15, wherein the step of providing the ferroelectric memory cell includes providing a first n-channel insulated gate field effect transistor having a first threshold voltage serving as the first field effect transistor and providing a second n-channel insulated gate field effect transistor having a second threshold voltage serving as the second field effect transistor.

17. The method for reading and restoring data in a ferroelectric memory cell as claimed in claim 16, wherein the step of placing the first and second field effect transistors in a conductive state includes applying a voltage higher than the first and second threshold voltages to the word line.

18. The method for reading and restoring data in a ferroelectric memory cell as claimed in claim 15, wherein the step of charging the bit line and the complementary bit line includes the steps of:

applying a charging voltage to the bit line and the complementary bit line; and removing the charging voltage applied to the bit line and the complementary bit line.

19. The method for reading and restoring data in a ferroelectric memory cell as claimed in claim 15, wherein the step of applying a charging voltage includes applying a supply voltage to the bit line and the complementary bit line.

20. The method for reading and restoring data in a ferroelectric memory cell as claimed in claim 15, wherein the step of applying a first data value voltage to the bit line and applying a second data value voltage to the complementary bit line in response to a potential at the bit line higher than a potential at the complementary bit line includes applying a supply voltage to the bit line and applying a ground voltage to the complementary bit line.

* * * * *